United States Patent
Kim et al.

(10) Patent No.: US 8,344,824 B2
(45) Date of Patent: Jan. 1, 2013

(54) ASYMMETRIC POWER DIVIDER

(75) Inventors: Yu Sin Kim, Gyunggi-do (KR); Song Cheol Hong, Daejeon (KR); Sang Hyun Baek, Daejeon (KR); Youn Suk Kim, Gyunggi-do (KR)

(73) Assignees: Samsung Electro-Mechanics Co., Ltd., Suwon, Gyunggi-Do (KR); Korea Advanced Institute of Science and Technology, Yuseong-Gu, Daejeon (KR)

( * ) Notice: Subject to any disclaimer, the term of this patent is extended or adjusted under 35 U.S.C. 154(b) by 207 days.

(21) Appl. No.: 12/768,432

(22) Filed: Apr. 27, 2010

(65) Prior Publication Data

US 2011/0121912 A1    May 26, 2011

(30) Foreign Application Priority Data

Nov. 26, 2009 (KR) .................. 10-2009-0115373

(51) Int. Cl.
   *H03H 7/38* (2006.01)
(52) U.S. Cl. ......... 333/124; 333/126; 333/129; 333/132
(58) Field of Classification Search .......... 333/124–129, 333/132
   See application file for complete search history.

(56) References Cited

U.S. PATENT DOCUMENTS

| | | | | |
|---|---|---|---|---|
| 4,580,114 A | * | 4/1986 | Upadhyayula | 333/100 |
| 5,045,822 A | * | 9/1991 | Mohwinkel | 333/124 |
| 5,070,304 A | * | 12/1991 | Salib et al. | 330/54 |
| 7,342,444 B2 | * | 3/2008 | Kim et al. | 330/124 R |
| 8,035,459 B2 | * | 10/2011 | Honda | 333/100 |

FOREIGN PATENT DOCUMENTS

| | | |
|---|---|---|
| JP | 2006-525749 A | 11/2006 |
| KR | 10-076051 B1 | 9/2007 |

OTHER PUBLICATIONS

Office Action from counterpart Korean Patent Application No. 10-2009-0115373, Feb. 25, 2011, 4 pages.

* cited by examiner

*Primary Examiner* — Robert Pascal
*Assistant Examiner* — Kimberly Glenn
(74) *Attorney, Agent, or Firm* — Blakely Sokoloff Taylor & Zafman LLP

(57) ABSTRACT

Disclosed herein is an asymmetric power divider. The asymmetric power divider includes a power dividing unit, a first matching network, and a second matching network. The power dividing unit supplies different amounts of power to a carrier amplifier and a peaking amplifier, which are connected in parallel. The first matching network is connected between the power dividing unit and the carrier amplifier so as to perform impedance matching between the power dividing unit and the carrier amplifier. The second matching network is connected between the power dividing unit and the peaking amplifier so as to perform impedance matching between the power dividing unit and the peaking amplifier.

9 Claims, 3 Drawing Sheets

ASYMMETRIC POWER DIVIDER

CROSS REFERENCE TO RELATED APPLICATION

This application claims the benefit of Korean Patent Application No. 10-2009-0115373, filed on Nov. 26, 2009, entitled "Asymmetrical Power Divider," which is hereby incorporated by reference in its entirety into this application.

BACKGROUND OF THE INVENTION

1. Technical Field

The present invention relates to an asymmetric power divider.

2. Description of the Related Art

As the paradigm of mobile communication systems was changed from analog communication to digital communication and the demand for not only voice but also a large amount of data communication such as multimedia data was increased, a third generation communication based on digital communication appeared.

Due to the influence of communications requiring a large amount of data, a technology such as Orthogonal Frequency Division Multiplexing (OFDM) was adopted. Although this technology enables the number of accessing users to be further increased, it has a problem in that an amplifier having excellent linearity must be used because the difference between the average output and the maximum output is large.

In general, a linear amplifier is used for a communication system using the magnitude and phase of a signal, and has a large Peak-to-Average Power Ratio (PAPR) in the case of a large amount of data communication using a technology such as OFDM.

As a result, a linear amplifier does not need to be used in a maximum output region having the highest efficiency, but must be used in a region having back-off corresponding to PAPR.

Furthermore, Code Division Multiple Access (CDMA) and Wideband Code Division Multiple Access (WCDMA) systems which do not use OFDM have the same problem.

Meanwhile, although from the viewpoint of a probability distribution function, a region having the greatest transmission frequency is not a maximum output region but an intermediate output region, a problem arises in that the total average efficiency is low because the efficiency of the linear amplifier is low in the intermediate output region.

Accordingly, in order to overcome the problem of the low efficiency of a typical linear amplifier, a Doherty amplifier, such as that shown in FIG. 1 was proposed.

FIG. 1 is a diagram showing a conventional Doherty amplifier.

As shown in FIG. 1, the conventional Doherty amplifier employs a quadrature hybrid coupler 110 for producing input signals so that they have the same magnitude and a phase difference of 90 degrees and a λ/4 transmission line 140 for producing transmitted signals having a phase difference of 90 degrees for input and output. When the magnitude of an input signal is low, only a carrier amplifier 120 operates and the peaking amplifier 130 is turned off. As an input signal is increased, the peaking amplifier 130 issues an output along with the carrier amplifier 120. Accordingly, the conventional Doherty amplifier has the advantage of improving efficiency at intermediate output.

However, the conventional Doherty amplifier is problematic in that integration is difficult and loss due to the use of passive elements occurs because the sizes of passive elements used for input and output are large.

Furthermore, according to the conventional Doherty amplifier, although signals having a phase difference of 90 degrees, which is divided into halves by the quadrature hybrid coupler 110 are applied to the carrier amplifier 120 and the peaking amplifier 130 in the same manner, the peaking amplifier 130 is normally operated at a bias equal to or lower than a threshold voltage, such as class C, to perform the Doherty operation, so that the peaking amplifier 130 is not saturated as completely as the carrier amplifier 120 due to the signals applied in the same manner.

Accordingly, there arises a problem in that it is difficult to achieve desired output because the demodulation of the load R is not completely performed.

In order to solve these problems, an attempt to transmit more output to the peaking amplifier 130 by making the carrier amplifier 120 and the peaking amplifier 130 different in size has been made. However, this attempt cannot fundamentally overcome imbalance occurring at the input side.

SUMMARY OF THE INVENTION

Accordingly, the present invention has been made keeping in mind the above problems occurring in the prior art, and the present invention is intended to provide an asymmetric power divider which employs active elements, thereby facilitating integration, reducing loss, and solving the problem of the low output of a peaking amplifier at low bias.

The present invention provides an asymmetric power divider, including a power dividing unit for supplying different amounts of power to a carrier amplifier and a peaking amplifier, which are connected in parallel; a first matching network connected between the power dividing unit and the carrier amplifier so as to perform impedance matching between the power dividing unit and the carrier amplifier; and a second matching network connected between the power dividing unit and the peaking amplifier so as to perform impedance matching between the power dividing unit and the peaking amplifier.

The power dividing unit supplies a larger amount of power to the peaking amplifier than it does to the carrier amplifier.

The power dividing unit includes a first amplifying unit disposed between an input terminal and the first matching network, formed to have a common gate, and configured to amplify an input signal; a second amplifying unit disposed between the input terminal and the second matching network to be connected in parallel with the first amplifying unit, formed to have a cascode structure, and configured to amplify an input signal; and a matching circuit connected between the input terminal and the first amplifying unit and between the input terminal and the second amplifying unit, and configured to perform impedance matching of an input signal and modulate a phase of an input signal so that an input signal supplied to the first amplifying unit and an input signal supplied to the second amplifying unit have a phase difference of 90 degrees.

The first amplifying unit includes an active element configured such that a source terminal thereof is connected to the matching circuit, a drain terminal thereof is connected to the first matching network and a gate terminal thereof is connected to battery power; and a resistor connected between the gate terminal of the active element and the battery power.

The first amplifying unit includes a bias control unit for adjusting bias output from a control voltage source in proportion to the input signal; an active element configured such that a source terminal thereof is connected to the matching circuit, a drain terminal thereof is connected to the first matching network and a gate terminal thereof is connected to the bias control unit; and a resistor connected between the gate terminal of the active element and the bias control unit.

The second amplifying unit includes a resistor and a capacitor connected in series between the control voltage source and a ground; a first active element configured such that a drain terminal thereof is connected to the second matching network and a gate terminal thereof is connected between the resistor and the capacitor; and a second active element configured such that a drain terminal thereof is connected to a source terminal of the first active element, a gate terminal thereof is connected to the matching circuit and a source terminal thereof is connected to the ground.

The second amplifying unit includes a resistor and a capacitor connected in series between the control voltage source and a ground; a first active element configured such that a drain terminal thereof is connected to the second matching network and a gate terminal thereof is connected between the resistor and the capacitor; a second active element configured such that a drain terminal thereof is connected to a source terminal of the first active element, a gate terminal thereof is connected to the matching circuit and a source terminal thereof is connected to the ground; and a bias control unit for adjusting bias output from the control voltage source in proportion to the input signal and providing the adjusted bias to the gate terminal of the first active element.

The matching circuit includes an inductor connected between the input terminal and a ground; and a capacitor connected between the input terminal and the second amplifying unit.

The first matching network includes an inductor connected between a control voltage source and the power dividing unit; a first capacitor connected between the power dividing unit and the carrier amplifier; and a second capacitor connected among the inductor, a common terminal of the first capacitor and a ground.

The second matching network includes an inductor connected between a control voltage source and the power dividing unit; a first capacitor connected between the power dividing unit and the peaking amplifier; and a second capacitor connected among the inductor, a common terminal of the first capacitor and ground.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
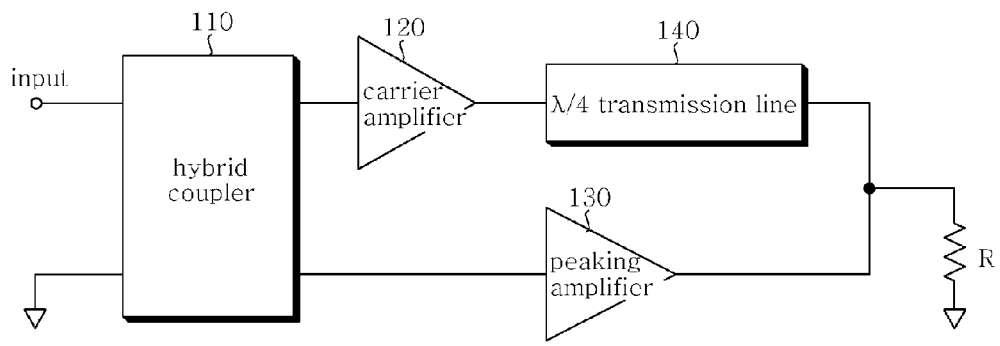
FIG. 1 is a diagram showing a conventional Doherty amplifier.

Reference now should be made to the drawings, in which the same reference numerals are used throughout the different drawings to designate the same or similar components. Furthermore, if in the following description of the present invention, detailed descriptions of related well-known technologies may unnecessarily make the gist of the present invention unclear, the detailed descriptions will be omitted from the following description.

Preferred embodiments of the present invention will be described below in detail with reference to the accompanying drawings.

Figure 2:
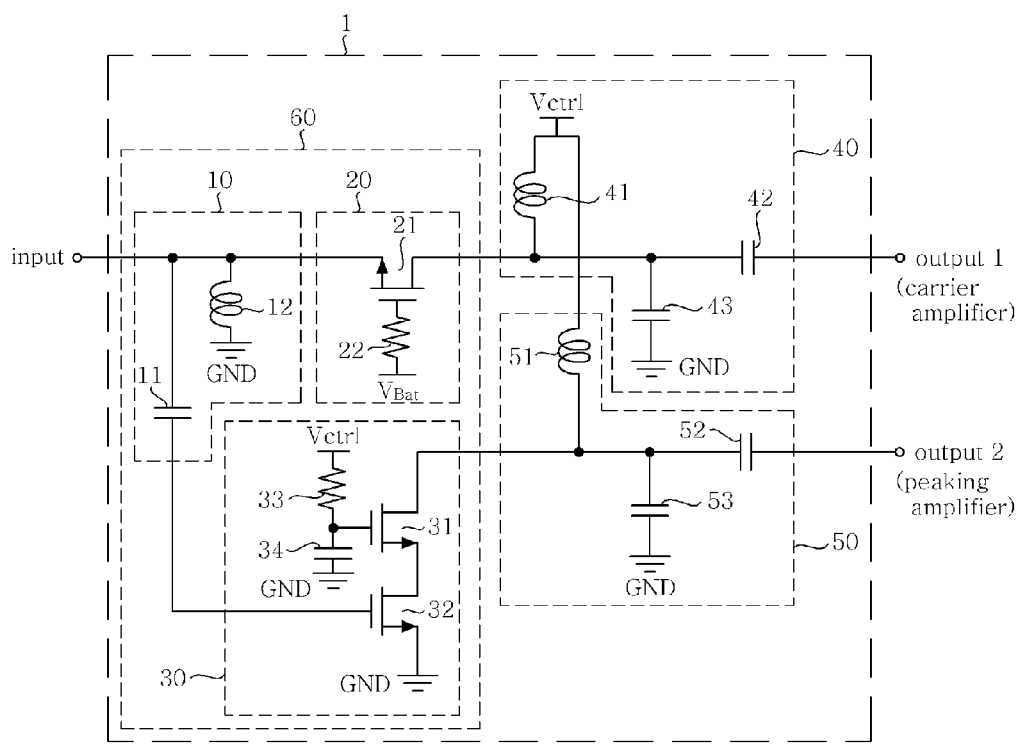
FIG. 2 is a circuit diagram of an asymmetric power divider according to an embodiment of the present invention.

FIG. 2 is a circuit diagram of an asymmetric power divider 1 according to an embodiment of the present invention.

The asymmetric power divider 1 according to the embodiment of the present invention, as shown in FIG. 2, includes a power dividing unit 60, a first matching network 40, and a second matching network 50.

The power dividing unit 60 supplies different amounts of power to a carrier amplifier and a peaking amplifier, which are connected in parallel. Preferably, the power dividing unit 60 supplies a larger amount of power to the peaking amplifier than it does to the carrier amplifier.

The power dividing unit 60 includes a matching circuit 10, a first amplifying unit 20, and a second amplifying unit 30.

The matching circuit 10 is connected between an input terminal and the first amplifying unit 20 and between the input terminal and the second amplifying unit 30, and performs the impedance matching of an input signal and modulates the phase of an input signal so that an input signal supplied to the first amplifying unit 20 and an input signal supplied to the second amplifying unit 30 have a phase difference of 90 degrees.

That is, the matching circuit 10 modulates the phase of an input signal by 90 degrees and then supplies the signal to the first amplifying unit 20, and supplies an input signal to the second amplifying unit 30 without modulating the phase of the input signal.

In this case, the phase modulated by the matching circuit 10 is changed to a phase identical to that of the output of the peaking amplifier by a $\lambda/4$ transmission line connected to the output terminal of the carrier amplifier as shown in FIG. 1.

The matching circuit 10 includes a first capacitor 11 connected between an input terminal and the second amplifying unit 30, that is, the gate terminal of a third active element 32, and a first inductor 12 connected between the input terminal and a ground GND.

Here, the first ends of the first inductor 12 and the first capacitor 11 are connected to the input terminal and the first amplifying unit 20, that is, the common terminal of the source terminal of a first active element 21, whereas the second end of the first inductor 12 is connected to the ground GND, and the second end of the first capacitor 11 is connected to the gate terminal of the third active element 32.

The first amplifying unit 20 is disposed between the input terminal and the first matching network 40, is configured to have a common gate structure, and amplifies an input signal and transmits the amplified signal to the first matching network 40.

For this purpose, the first amplifying unit 20 includes the first active element 21 configured such that the source terminal thereof is connected to the matching circuit 10, the drain terminal thereof is connected to the first matching network 40 and the gate terminal thereof is connected to driving power (for example, battery power Vbat) and a first resistor 22 connected between the gate terminal of the first active element 21 and the driving power source.

Since a battery power Vbat higher than 0 V is supplied to the gate terminal of the first active element 21 as described above, the first amplifying unit 20 always amplifies an input signal regardless of the magnitude of the input signal.

The second amplifying unit 30 is disposed between the input terminal and the second matching network 50 to be connected in parallel to the first amplifying unit 20, and amplifies an input signal.

Here, the second amplifying unit 30 is configured to have a common source structure, that is, a cascode structure, so that it supplies a larger amount of power to the peaking amplifier than it does to the carrier amplifier as the input signal is increased.

The second amplifying unit 30 includes a second resistor 33 and a second capacitor 34 connected in series between a control voltage source Vctrl for always providing a bias higher than 0 V and a ground GND, a second active element 31 configured such that the drain terminal thereof is connected to the second matching network 50 and the gate terminal thereof is connected between the second resistor 33 and the second capacitor 34, and the third active element 32 configured such that the drain terminal thereof is connected to the source terminal of the second active element 31, the gate terminal thereof is connected to the matching circuit 10 and the source terminal thereof is connected to the ground GND.

Since the gate terminal of the third active element 32 is connected to the input terminal as described above, the second amplifying unit 30 is selectively turned on and off according to the magnitude of an input signal input through the input terminal, so that the second amplifying unit 30 amplifies power more than the first amplifying unit 20 as the input signal is increased to a value equal to or greater than a specific value (for example, the threshold value of the third active element 32).

The first matching network 40 is connected between the first amplifying unit 20 and the carrier amplifier, and performs impedance matching between the first amplifying unit 20 and the carrier amplifier.

For this purpose, the first matching network 40 includes a second inductor 41 connected between the control voltage source Vctrl for always providing a bias equal to or higher than 0 V and the drain terminal of the first active element 21, a third capacitor 42 connected between the drain terminal of the first active element 21 and the input terminal of the carrier amplifier, and a fourth capacitor 43 connected between the drain terminal of the first active element 21 and the ground GND.

The second matching network 50 is connected between the second amplifying unit 30 and the peaking amplifier, and performs impedance matching between the second amplifying unit 30 and the peaking amplifier.

For this purpose, the second matching network 50 includes a third inductor 51 connected between a control voltage source Vctrl for always providing a bias equal to or higher than 0 V and the drain terminal of the second active element 31, a fifth capacitor 52 connected between the drain terminal of the third active element 32 and the input terminal of the peaking amplifier, and a sixth capacitor 53 connected between the drain terminal of the second active element 31 and the ground GND.

In the above-described asymmetric power divider 1 according to an embodiment of the present invention, the first active element 21, the second active element 31 and the third active element 32 are formed of MOSFETs, preferably N-type MOSFETs.

In the asymmetric power divider 1 according to the embodiment of the present invention, the first amplifying unit 20 always amplifies an input signal to a specific magnitude regardless of the magnitude of the input signal because the first active element 21 is always operated using the battery power Vbat, while the second amplifying unit 30 does not operate when the input signal is lower than a reference value (for example, the threshold voltage of the third active element 32) and operates only when the input signal is equal to or higher than the reference value (for example, the threshold voltage of the third active element 32) because the third active element 32 is operated according to the magnitude of an input signal.

Accordingly, when an input signal is equal to or lower than the reference value, only the first amplifying unit 20 amplifies the input signal and transmits the amplified input signal to the amplifier through the first matching network 40. If an input signal is equal to or higher than the reference value, both the first amplifying unit 20 and the second amplifying unit 30 amplify input signals, and transmit the amplified signals to the carrier amplifier and the peaking amplifier, respectively.

Here, since the first amplifying unit 20 is configured to have a common gate structure and the second amplifying unit 30 is configured to have a cascode structure, an input signal is transmitted to the second amplifying unit 30 rather than the first amplifying unit 20 as the input signal increases.

Figure 3:
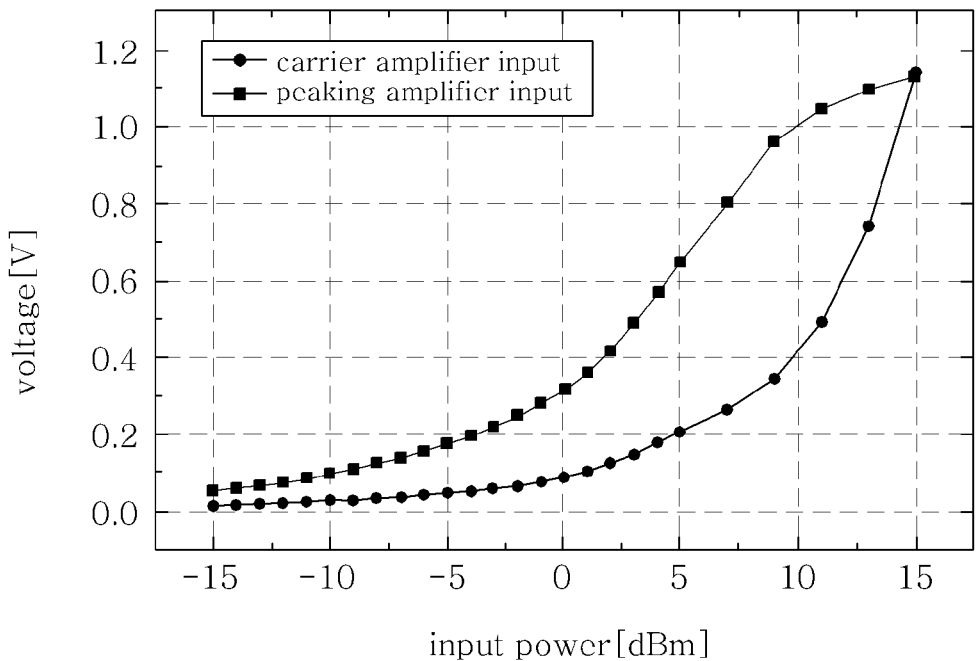
FIG. 3 is a graph showing the output waveform of the asymmetric power divider shown in FIG. 2.
Figure 4:
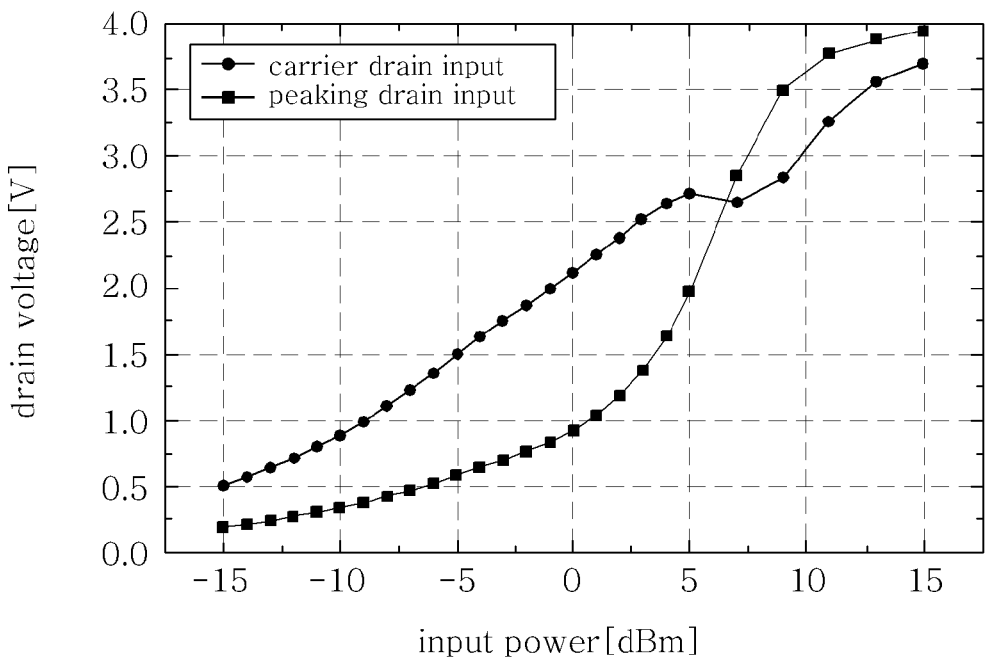
FIG. 4 is a graph showing an output waveform at the drain node of the asymmetric power divider shown in FIG. 2.

Therefore, as shown in FIGS. 3 and 4, as input signals become higher, the magnitude of a signal input to the carrier amplifier becomes higher than that of a signal input to the peaking amplifier.

Since the asymmetric power divider 1 according to the embodiment of the present invention performs asymmetric power distribution using active elements, integration is facilitated and loss can be reduced.

Furthermore, since the asymmetric power divider 1 according to the embodiment of the present invention is configured such that the first amplifying unit 20 for supplying signals to the carrier amplifier is configured to have a common gate structure and the second amplifying unit 30 for supplying a signal to the peaking amplifier is configured to have a cascode structure, the magnitude of a signal input to the peaking amplifier can become higher than that of a signal input to the carrier amplifier as input signals become higher, thereby implementing asymmetric power distribution.

Meanwhile, in the asymmetric power divider 1 according to the embodiment of the present invention, a relatively higher input signal is transmitted to the peaking amplifier as the input signal is increased, so that the peaking amplifier can be saturated as completely as the carrier amplifier at low bias, thereby overcoming the problem of low output at low bias.

Figure 5:
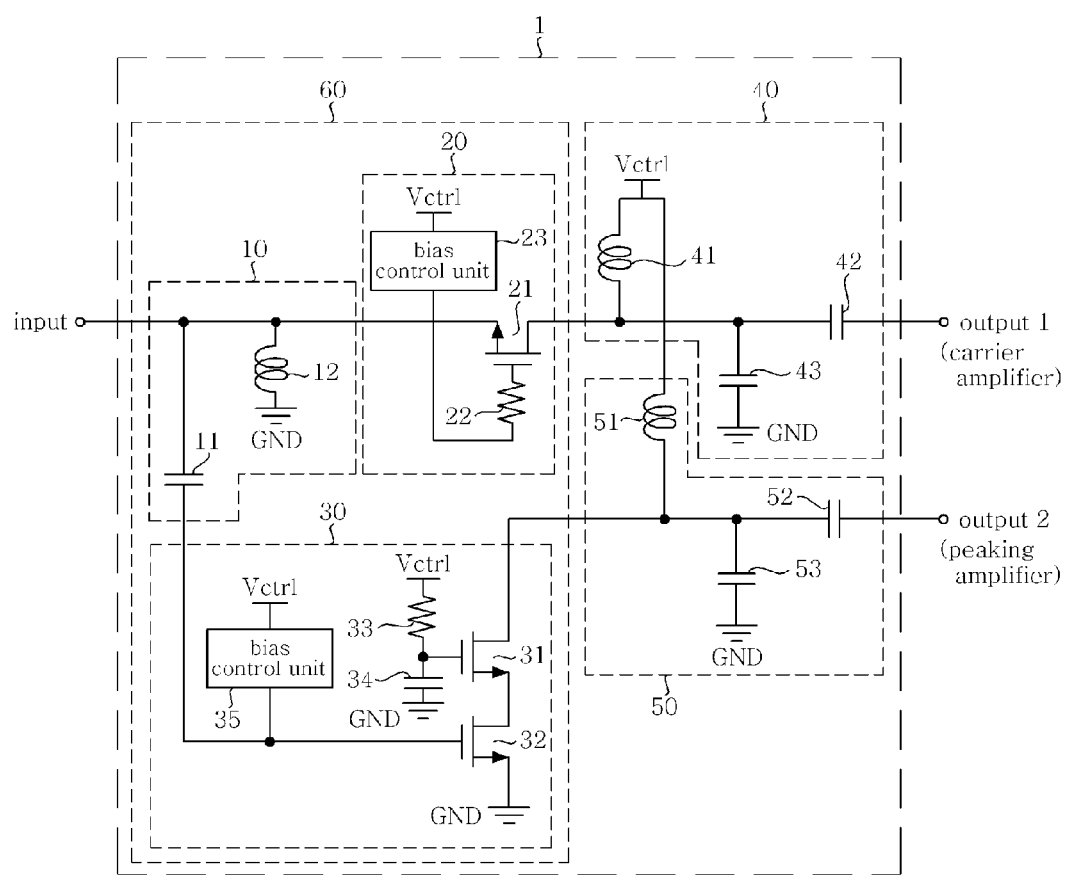
FIG. 5 is a circuit diagram of an asymmetric power divider according to another embodiment of the present invention.

FIG. 5 is a circuit diagram of an asymmetric power divider 1 according to another embodiment of the present invention.

The asymmetric power divider 1 according to another embodiment of the present invention, as shown in FIG. 5, includes a power dividing unit 60, a first matching network 40, and a second matching network 50.

Since the power divider 1 according to another embodiment of the present invention is configured to have a different power dividing unit 60 and the same first matching network 40 and second matching network 50 compared to the power divider 1 according to the embodiment of the present invention shown in FIG. 2, the above relevant descriptions are used as descriptions of the functions and constructions of the first matching network 40 and the second matching network 50.

The power dividing unit 60 supplies different amounts of power to a carrier amplifier and a peaking amplifier, which are connected in parallel. Preferably, the power dividing unit 60 supplies a larger amount of power to the peaking amplifier than it does to the carrier amplifier.

The power dividing unit 60 includes a matching circuit 10, a first amplifying unit 20, and a second amplifying unit 30.

The matching circuit 10 is connected between an input terminal and the first amplifying unit 20 and between the input terminal and a second amplifying unit 30, and performs the impedance matching of the input signal and modifies the phase of an input signal so that an input signal supplied to the first amplifying unit 20 and an input signal supplied to the second amplifying unit 30 have a phase difference of 90 degrees.

That is, the matching circuit 10 modifies the phase of an input signal by 90 degrees and the modified signal to the first amplifying unit 20, and supplies an input signal to the second amplifying unit 30 without changing the phase of the input signal.

In this case, the phase modulated by the matching circuit 10 is changed to a phase identical to that of the output of the peaking amplifier by a λ/4 transmission line connected to the output terminal of the carrier amplifier as shown in FIG. 1.

The matching circuit 10 includes a first capacitor 11 connected between an input terminal and the second amplifying unit 30, that is, the gate terminal of a third active element 32, and a first inductor 12 connected between the input terminal and a ground GND.

Here, the first ends of the first inductor 12 and the first capacitor 11 are connected to the input terminal and the first amplifying unit 20, that is, the common terminal of the source terminal of a first active element 21, whereas the second end of the first inductor 12 is connected to the ground GND, and the second end of the first capacitor 11 is connected to the gate terminal of the third active element 32.

The first amplifying unit 20 is disposed between the input terminal and the first matching network 40, is configured to have a common gate structure, and amplifies an input signal and transmits the amplified signal to the first matching network 40.

For this purpose, the first amplifying unit 20 includes a bias control unit 23 configured to adjust a control bias output from a control voltage source Vctrl for always providing a bias equal to or higher than 0 V in response to an input signal, the first active element 21 configured such that the source terminal thereof is connected to the matching circuit 10, the drain terminal thereof is connected to the first matching network 40 and the gate terminal thereof is connected to the bias control unit 23, and a first resistor 22 connected between the gate terminal of the first active element 21 and the bias control unit 23.

Here, the bias control unit 23 provides bias output from the control voltage source Vctrl for always providing a bias equal to or higher than 0 V to the gate terminal of the first active element 21, and adjusts bias output from the control voltage source Vctrl and to be provided to the gate terminal of the first active element 21 in response to an input signal.

That is, the bias control unit 23 adjusts bias in proportion to an input signal. That is, the bias control unit 23 increases bias to be supplied to the gate terminal of the first active element 21 as an input signal is increased, and decreases bias to be supplied to the gate terminal of the first active element 21 as an input signal is decreased.

Since a battery power Vbat higher than 0 V is supplied to the gate terminal of the first active element 21, the first amplifying unit 20 always amplifies an input signal regardless of the magnitude of the input signal.

The second amplifying unit 30 is disposed between the input terminal and the second matching network 50 to be connected in parallel to the first amplifying unit 20, and amplifies an input signal.

Here, the second amplifying unit 30 is configured to have a common source structure, that is, a cascode structure, so that it supplies a larger amount of power to the peaking amplifier than it does to the carrier amplifier as the input signal is increased.

The second amplifying unit 30 includes a second resistor 33 and a second capacitor 34 connected in series between a control voltage source Vctrl for always providing a bias higher than 0 V and a ground GND, a second active element 31 configured such that the drain terminal thereof is connected to the second matching network 50 and the gate terminal thereof is connected between the second resistor 33 and the second capacitor 34, the third active element 32 configured such that the drain terminal thereof is connected to the source terminal of the second active element 31, the gate terminal thereof is connected to the matching circuit 10 and the source terminal thereof is connected to the ground GND, and the bias control unit 35 for adjusting bias output from a control voltage source Vctrl and providing the adjusted bias to the gate terminal of the third active element 32.

Here, the bias control unit 35 adjusts bias in proportion to an input signal. That is, the bias control unit 35 increases bias to be supplied to the gate terminal of the third active element 32 as an input signal is increased, and decreases bias to be supplied to the gate terminal of the third active element 32 as an input signal is decreased.

The second amplifying unit 30 amplifies an input signal in such a way that the gate terminal of the third active element 32 is selectively turned on and off in response to the magnitude of the input signal input through the input terminal and bias supplied through the bias control unit 35.

Since the bias control unit 35 adjusts bias supplied to the gate terminal of the third active element 32 in response to the magnitude of an input signal as described above, the second amplifying unit 30 can extend the magnitude range of an input signal transmitted to the peaking amplifier, compared to the asymmetric power divider 1 of FIG. 3 according to the embodiment of the present invention which provides only an input signal to the gate terminal of the third active element 32.

In the above-described asymmetric power divider 1 according to another embodiment of the present invention, the first active element 21, the second active element 31 and the third active element 32 are formed of MOSFETs, preferably N-type MOSFETs.

Since the bias control units 23 and 35 adjust bias in response to the magnitude of an input signal and supply the bias to the gate terminal of the first active element 21 and the gate terminal of the third active element 32, the asymmetric power divider 1 according to another embodiment of the present invention can extend the magnitude range of the input signal input to the peaking amplifier, compared to the asymmetric power divider 1 of FIG. 3 according to the embodiment of the present invention which supplies fixed bias (that is, battery voltage Vbat) to the gate terminal of the first active element 21.

Furthermore, since the gate bias of the first active element 21 is adjusted in response to an input signal, a voltage equal to or higher than a threshold voltage is always supplied to the gate terminal of the first active element 21, so that the asymmetric power divider 1 according to another embodiment of the present invention can reduce power consumption due to quiescent current and, therefore, can improve average efficiency.

According to the present invention, the asymmetric power divider is implemented using active elements, so that there are advantages in that the problem of the low output of the peaking amplifier due to the low bias of the Doherty amplifier can be overcome, loss due to the use of passive elements can be reduced, and integration is facilitated because the area can be reduced.

Furthermore, according to the present invention, since bias supplied to active elements can be adjusted in response to an input signal using the bias control unit, power consumption due to quiescent current can be reduced, so that there is an advantage in that average efficiency can be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An asymmetric power divider, comprising:
a power dividing unit for supplying different amounts of power to a carrier amplifier and a peaking amplifier, which are connected in parallel;
a first matching network connected between the power dividing unit and the carrier amplifier so as to perform impedance matching between the power dividing unit and the carrier amplifier; and
a second matching network connected between the power dividing unit and the peaking amplifier so as to perform impedance matching between the power dividing unit and the peaking amplifier;
a first amplifying unit disposed between an input terminal and the first matching network, formed to have a common gate, and configured to amplify a first input signal;
a second amplifying unit disposed between the input terminal and the second matching network connected in parallel with the first amplifying unit, formed to have a cascode structure, and configured to amplify a second input signal; and
a matching circuit connected between the input terminal and the first amplifying unit and between the input terminal and the second amplifying unit, and configured to perform impedance matching and modulate a phase of the input terminal's input signal so that the first input signal supplied to the first amplifying unit and the second input signal supplied to the second amplifying unit have a phase difference of substantially 90 degrees.

2. The asymmetric power divider as set forth in claim 1, wherein the power dividing unit supplies a larger amount of power to the peaking amplifier than it does to the carrier amplifier.

3. The asymmetric power divider as set forth in claim 1, wherein the first amplifying unit comprises:
an active element configured such that a source terminal thereof is connected to the matching circuit, a drain terminal thereof is connected to the first matching network and a gate terminal thereof is connected to battery power; and
a resistor connected between the gate terminal of the active element and the battery power.

4. The asymmetric power divider as set forth in claim 1, wherein the first amplifying unit comprises:
a bias control unit for adjusting bias output from a control voltage source in proportion to the input signal;
an active element configured such that a source terminal thereof is connected to the matching circuit, a drain terminal thereof is connected to the first matching network and a gate terminal thereof is connected to the bias control unit; and
a resistor connected between the gate terminal of the active element and the bias control unit.

5. The asymmetric power divider as set forth in claim 1, wherein the second amplifying unit comprises:
a resistor and a capacitor connected in series between the control voltage source and a ground;
a first active element configured such that a drain terminal thereof is connected to the second matching network and a gate terminal thereof is connected between the resistor and the capacitor; and
a second active element configured such that a drain terminal thereof is connected to a source terminal of the first active element, a gate terminal thereof is connected to the matching circuit and a source terminal thereof is connected to the ground.

6. The asymmetric power divider as set forth in claim 1, wherein the second amplifying unit comprises:
a resistor and a capacitor connected in series between the control voltage source and a ground;
a first active element configured such that a drain terminal thereof is connected to the second matching network and a gate terminal thereof is connected between the resistor and the capacitor;
a second active element configured such that a drain terminal thereof is connected to a source terminal of the first active element, a gate terminal thereof is connected to the matching circuit and a source terminal thereof is connected to the ground; and
a bias control unit for adjusting bias output from the control voltage source in proportion to the input signal and providing the adjusted bias to the gate terminal of the first active element.

7. The asymmetric power divider as set forth in claim 1, wherein the matching circuit comprises:
an inductor connected between the input terminal and a ground; and
a capacitor connected between the input terminal and the second amplifying unit.

8. The asymmetric power divider as set forth in claim 1, wherein the first matching network comprises:
an inductor connected between a control voltage source and the power dividing unit;
a first capacitor connected between the power dividing unit and the carrier amplifier; and
a second capacitor connected among the inductor, a common terminal of the first capacitor and a ground.

9. The asymmetric power divider as set forth in claim 1, wherein the second matching network comprises:
an inductor connected between a control voltage source and the power dividing unit;
a first capacitor connected between the power dividing unit and the peaking amplifier; and
a second capacitor connected among the inductor, a common terminal of the first capacitor and ground.

* * * * *